US005989634A

United States Patent [19]
Isenberg

[11] Patent Number: 5,989,634
[45] Date of Patent: Nov. 23, 1999

[54] PROCESS OF MANUFACTURING SOLID OXYGEN ION CONDUCTING OXIDE LAYERS

[76] Inventor: Arnold O. Isenberg, 327 Woodside Rd., Pittsburgh, Pa. 15221

[21] Appl. No.: 08/882,579

[22] Filed: Jun. 25, 1997

[51] Int. Cl.[6] ........................................ C23C 16/40
[52] U.S. Cl. ........................ 427/255.32; 427/255.33; 427/255.35; 205/344; 205/538; 205/542
[58] Field of Search ................... 427/115, 255.3, 427/255.32, 255.33, 255.35; 205/344, 538, 542

[56] References Cited

U.S. PATENT DOCUMENTS 4,597,170   7/1986   Isenberg ................................. 29/623.5

OTHER PUBLICATIONS

Pais et al., Br. Ceram. Proc., 56, pp. 53–70, Sep. 1996.

*Primary Examiner*—Timothy Meeks
*Attorney, Agent, or Firm*—Klaus J. Bach

[57] ABSTRACT

Electrochemical vapor deposition (EVD) of oxygen ion conducting and mixed conducting, oxygen-ionic/electronic, oxide layers is achieved at near atmospheric pressure process conditions by employing metals and metal compounds for removal and/or recovery of the free halogen byproduct of the EVD reaction. The metals and metal compounds are employed as solids, vapors, and as oxides in intimate mixture with carbon directly within the deposition zone together with the substrates to be coated. The process leads to significant cost reduction, for instance, in the fabrication of thin layers of solid oxygen ion conducting electrolytes, for fuel cells, gas separators, and gas sensors, when compared to state-of-the-art EVD processes which are conducted under vacuum conditions.

20 Claims, 5 Drawing Sheets

PROCESS OF MANUFACTURING SOLID OXYGEN ION CONDUCTING OXIDE LAYERS

BACKGROUND OF THE INVENTION

1. Field of the Invention

The present invention relates mainly to the fabrication of thin layers of solid oxygen ion conductors for high temperature electrochemical devices such as solid oxide fuel cells, oxygen gas separators, solid oxide electrolyzers for water vapor and/or carbon dioxide, and gas sensors. In the most important application the process relates to the fabrication of thin layers of oxygen ion conductors such as, stabilized zirconia, doped hafnia, and doped ceria as well as mixed conducting oxides which are conducting via oxygen ions as well as by electrons or holes. Devices which operate on the principal of oxygen ion conduction are important in the field of electric power generation, combustion control, oxygen gas separation from air, sythetic gas generation, and life support systems. It is of great importance that devices which are based on solid oxygen ion conductors and which are applied in these fields are efficient, reliable, reproducible in manufacturing, and cost competitive. The solid oxide layers are used in electrochemical cells as electrolytes with applied electrodes, or as semipermeable membranes for oxygen; they are made thin and operate at high temperatures in order to reduce electrical resistance losses.

Electrochemical vapor deposition (EVD) is a high temperature process where metal halide vapors react with oxygen in an electrochemical way, and where the desired reaction product is a thin and pore free oxide layer, deposited on top of a suitable substrate. EVD is used mainly for manufacturing of thin oxide layers which conduct electrically at elevated temperatures by the movement of oxygen ions. Mixed conducting oxides, which conduct by oxygen ions as well as by electronic charges, can also be made into thin layers by EVD, they are called here mixed conducting, oxygen-ionic/electronic, oxide layers; they are used in oxygen gas separation devices and for the generation of sythetic gas consisting of hydrogen and/or carbon monoxide.

EVD is the major process used in the manufacturing of oxygen ion conducting electrolyte layers for solid oxide fuel cell generators, when one counts the tested kilowatts as well as the delivered kilowatt hours of installed fuel cell generators as a measure for the application of the process. The most common solid oxide electrolyte, made by EVD in the form of approximately 0.002" thick layers, is yttria-stabilized zirconia. Beside EVD, other processes such as sintering, plasma spraying, physical vapor deposition, tape casting, and others, are being considered as potential processes for the manufacturing of thin layers of solid oxide electrolytes. The three most common oxygen ion conductors considered in this field of application are based on doped stabilized zirconia, doped ceria and doped bismuth oxide.

Electrochemical cells, similar in construction to fuel cells, can be used to decompose water vapor and carbon dioxide electrolytically into oxygen, hydrogen, and carbon monoxide, respectively. In such an application the oxygen ion conducting electrolyte layers, such as yttria-stabilized zirconia, must be thin and gas impervious for energy efficiency in operation which is achieved reliably by producing the electrolyte by EVD. Layers with a thickness of several micrometers can be deposited pore free and vacuum tight into porous substrates, whereby the substrate serves as structural support as well as electrical contact to one side the electrolyte.

Mixed conducting, oxygen-ionic/electronic, electrolyte layers can also be made by EVD. Such oxide materials are permeable to oxygen by ionic conduction, and gas separation devices can be constructed which separate oxygen from air by applying an oxygen partial pressure gradient across a membrane made of a mixed conducting oxide. Again, a thin layer of the mixed conductor is the key for energy efficient device operation.

Another field of application of the invention is in the manufacturing of thin solid electrolyte layers for gas sensors in combustion control application, a reduction in oxide layer thickness allows device miniaturization and cost reduction. EVD is an ideal process to manufacture such devices.

All the devices described above must be heated to operating temperatures of between 300° C. and 1000° C. to reduce their electrical resistance and to perform reliably. Producing thin layers of oxygen ion conductors for solid state electrochemical devices, therefore, is the field of this invention.

State-of-the-art EVD is executed at high temperatures as high as 1300° C. and at low pressure which requires the operation and maintenance of vacuum pumping systems. Also, high temperature vacuum furnaces are required for the deposition of thin layer solid electrolytes. The requirement of vacuum pumps, vacuum furnaces, and their maintenance present major engineering challenges in developing the EVD process into a low cost manufacturing process. The invention relates to these engineering and manufacturing problems.

2. Description of the Prior Art

The process of EVD was first published in the Proceedings of ECS—Symposium, Electrode Materials and Processes for Energy Conversion and Storage, 1977, Vol. 77-6, pp 572–583 (A. O. Isenberg). The publication describes the basic elements of a vacuum EVD process for making thin layers of oxygen ion conducting complex oxides such as yttria-stabilized zirconia and gadolinia doped ceria, and of the mixed conducting complex oxide lanthanum chromite.

U.S. Pat. No. 4,609,562 (A. O. Isenberg, G. E. Zymboly) teaches an apparatus and method to execute the vacuum EVD process for producing yttria-stabilized zirconia electrolyte layers and layers of lanthanum chromite doped with magnesium over porous surfaces. U.S. Pat. No. 4,597,170 (A. O. Isenberg) teaches the application of the vacuum EVD process as a means to bond a porous nickel electrode to a layer of yttria-stabilized solid electrolyte by partially embedding the nickel particles into the same electrolyte material. Another patent, U.S. Pat. No. 5,106,654 (A. O. Isenberg), teaches the application of the vacuum EVD process in the formation of a composite material layer consisting of particles of chromites and manganites together with stabilized zirconia to provide a mixed conducting membrane which conducts electronically via the embedded chromite or manganite particles, and which conducts oxygen ions via the dense stabilized zirconia which surrounds the particles.

The process of EVD has been investigated with respect to growth mechanism and kinetics, as reported in the scientific literature. The following references present a good understanding of the process High Temp Sci. 27, 2512, 1990 (U. B. Pal et al.); J. Electrochem. Soc. 137, 2937, 1986 (U. B. Pal et al.; J. Electrochem. Soc. 133, 1583, 1986 (J. H. Enloe et al.). Further experimental investigations of the EVD process are reported by: J. Electrochem. Soc., 142, 3851, 1995 (H. W. Brinkman et al.) which describes the deposition of doped zirconia over porous media of different chemical composition and pore diameters. The publication J. Electrochem. Soc. 144, 1362, 1997, (R. Ioroi et al.) reports the successful EVD deposition of a double layer of two distinctly different compositions, where one layer consists of mixed conducting (oxygen-ionic/electronic) doped lanthanum manganite over a first layer of yttria-stabilized zirconia.

Most of the investigations report EVD process parameters for temperature and pressure in the range of 900° C. to 1300° C. and less than 1 Torr to 10 Torr, respectively. The high temperature is a requirement for achieving favorable EVD growth conditions for the thin oxide material. The low pressure in an EVD reactor beneficially affects the growth rate and quality of the deposits because the gaseous byproduct of the deposition reaction, namely halogen (mostly chlorine from vaporized metal chlorides) is removed from the reaction zone by continuous mechanical pumping. The low pressure EVD processes which are reported and described in the open patent and scientific literature reveal that only halide vapors of such metals are introduced into the reaction zone which are intended to be incorporated into the deposits as oxides. The reaction zone is identical with deposition chamber and is called here the reaction zone/deposition chamber.

This invention teaches that favorable EVD process conditions have been discovered for the fabrication of oxygen ion conducting and mixed conducting oxide layers on porous support structures at or near atmospheric pressure which has not been accomplished as of to date. This invention, therefore, represents a major cost reduction step in the manufacturing of thin and pore free oxygen ions conducting layers for high temperature electrochemical devices, such as oxygen generators, solid oxide fuel cells, solid oxide electroysis cells, gas separator devices, and combustion and process control sensors, all of which require that the thin oxide layers are deposited onto porous electrodes or onto other porous support structures to insure mechanical integrity of the devices.

SUMMARY OF THE INVENTION

It is the objective of this invention to provide a process method to permit the successful execution of the EVD process at significantly increased pressure levels, at or near atmospheric pressure, as compared to the state-of-the-art vacuum EVD process, which operates at pressures of up to several Torr. The objective of this invention is achieved by the introduction of foreign reactants in the form of metals and metal compounds directly into the reaction/deposition chamber without causing deleterious contamination of the deposited oxygen ion conducting or mixed conducting, oxygen-ionic/electronic, oxide layers. Also, this invention teaches that the metal halide delivery system to the reaction/deposition zone can be intimately integrated with the reaction/deposition zone in physical and chemical respects, which greatly simplifies the EVD reactor design.

The EVD process involves the sum reaction of vaporized metal halides, most preferably metal chlorides, with oxygen to form metal oxides and gaseous free halide. The mass action law in the chemical science teaches, that the removal of a reaction byproduct from the chemical equilibrium of a reaction affects favorably the forward reaction and the yield of the desired reaction product. This is a major reason why the EVD processes to date are executed under vacuum, because the removal of the free halide reaction byproduct by pumping enhances the growth of the thin oxide layers favorably.

The oxide formation in the EVD process is unique, when compared with chemical vapor deposition (CVD), in that the reaction product, in the form of a pore free oxide layer, physically separates the reactants from each other. In CVD all reaction participants are in intimate contact with each other. In EVD, however, oxygen can react with the metal halide vapors only by solid state ionic diffusion through the reactant-separating oxide layer. This oxide layer represents the desired reaction product which grows in thickness by the electrochemical reaction of oxygen ions with metal halide vapors.

The oxygen ion diffusion through the oxide reaction product toward the metal chloride vapors, and therefore the forward reaction, requires also electronic conduction in addition to the oxygen ionic conduction of the growing oxide layer. The degree of ionic and electronic conductance of the oxide reaction product depends much on its chemical composition. The ratio of ionic to electronic character is very high in the case of EVD deposited yttria stabilized zirconia, which is essentially a pure oxygen ion conductor at device temperatures. The ratio is low in doped lanthanum chromite which is mostly an electronic conductor. The EVD process temperature is 1000° C. or higher. At such high temperatures and in the presence of the metal halides most oxides have sufficient oxygen ion and electronic conduction as needed for layer growth by EVD.

The EVD process according to this invention is best explained, as a typical example only, for the case of depositing yttria stabilized zirconia in the form of thin oxygen ion conducting layers, by using zirconium tetrachloride and yttria trichloride vapors as halide reactants.

An essential part in this invention are the embodiments of method for removing the free chlorine gas reaction byproduct of the EVD reaction at by the introduction of metal vapors, metal chloride vapors, solid metals, and metal oxide/carbon admixtures directly in the reaction/deposition zone of the EVD process. The free chlorine removing solid metals and solid oxide/carbon mixtures are in near proximity, but physically separated, to the deposition substrate, while the chlorine removing vaporized metal and metal chlorides are in intimate contact with the substrate throughout the EVD process. The surprising fact in this invention is, that the addition of these compounds, although potentially highly contaminating, are not incorporated into the oxide product layer to any significant and undesirable degree.

A comparable addition of foreign metal species to a CVD process would lead to serve product (oxide layer) contamination as compared to the case of EVD, because several different and highly undesirable reactions involving the co-deposition of different oxides would take place in parallel. The fact that this contamination does not take place in the EVD reaction, can only be attributed to the separation of the oxygen reactant from the vaporized metal halides by the oxide reaction product layer, and by the selective reaction of the diffusing oxygen ions with desirable metal chloride species only.

The sole purpose, therefore, for the addition of the mentioned vapors and solids directly in the reaction/deposition zone of an EVD reactor, is to react with free chlorine and remove it continuously during the EVD reaction.

Another major objective of this invention is the addition of solids in the reaction/deposition zone which are not contaminating and serve a dual purpose, namely, first remove the chlorine gas from the EVD deposition reaction by reacting with the chlorine to form metal chlorides of the desired composition and, second, return the metal chlorides to the deposition reaction. The solids which are placed in the deposition zone, consisting of metals or oxide/carbon mixtures, therefore, must be of the same base metal which is to be deposited as oxides forming a gas impervious layer by the atmospheric EVD process. This special embodiment of the invention provides for an in situ reactant regeneration and metal chloride delivery system that is chemically and physically integrated with the actual deposition reaction.

This specific embodiment of the EVD process according to this invention, involving in situ reactant regeneration, is distinctly and fundamentally different in the mechanism of oxide layer growth as compared to other well known processes which make use of high temperature chemical gas transport reactions. The significant differences between such a chemical transport processes and the EVD process of the invention, involving reactant regeneration, lie in the facts that, in EVD, one major reactant, namely oxygen, is completely separated from the metal chloride vapor species by the growing oxide layer, and that the actual deposition reaction proceeds without applying temperature gradients or intermediate gaseous reactants, as usually done in chemical gas transport reactions. Also, in chemical transport reactions all gaseous and solid reactions participants communicate freely with each other through the gas phase, which is not the case for EVD involving in situ reactant regeneration in accordance with this invention.

It is obvious form the description of the EVD process according to the invention, that the removal of chlorine as reaction byproduct is not accomplished by pumping and means of low pressure, but by chemical reactions which are not detrimental to the quality of the deposit. As a consequence, the EVD process according to this invention can be executed without vacuum pumps and at much higher pressure levels as compared to the state-of-the-art vacuum EVD process, and atmospheric pressure EVD processing is now possible.

This invention, in its various embodiments, therefore, provides solutions to the problem of reducing the high cost of state-of-the-art vacuum EVD processes by eliminating or greatly reducing the pumping requirements and its associated expenses. This goal is achieved by making it possible to conducting the EVD process at or near atmospheric pressure as well as by greatly simplifying the metal chloride delivery system and improving metal chloride vapor utilization by in situ metal chloride vapor regeneration.

This invention will become more readily apparent, from the following description of embodiments thereof shown by way of example only and in schematic presentation in the accompanying drawings.

DESCRIPTION OF THE PREFERRED EMBODIMENTS

The following descriptive explanation of the invention is best accomplished by the example of the process to deposit an yttria-stabilized zirconia electrolyte layer over a porous substrate, such as porous doped lanthanum manganite, a material, which is a frequently used for electrodes in high temperature electrochemical cells.

In FIGS. 1 through 5 all metal halide species, which react with oxygen ions to form the oxygen ion conducting or the mixed conducting, oxygen-ionic/electronic, oxide layers, are indicated as $MeCl_4$ as representing metal chloride vapors in general and as an example only for writing a simple electrochemical reaction which represents the basic EVD reaction. The reactants for the removal of free chlorine in the FIGS. 2 through 5, however, are indicated with their actual chemical formula, reflecting valence states and composition.

Figure 1:
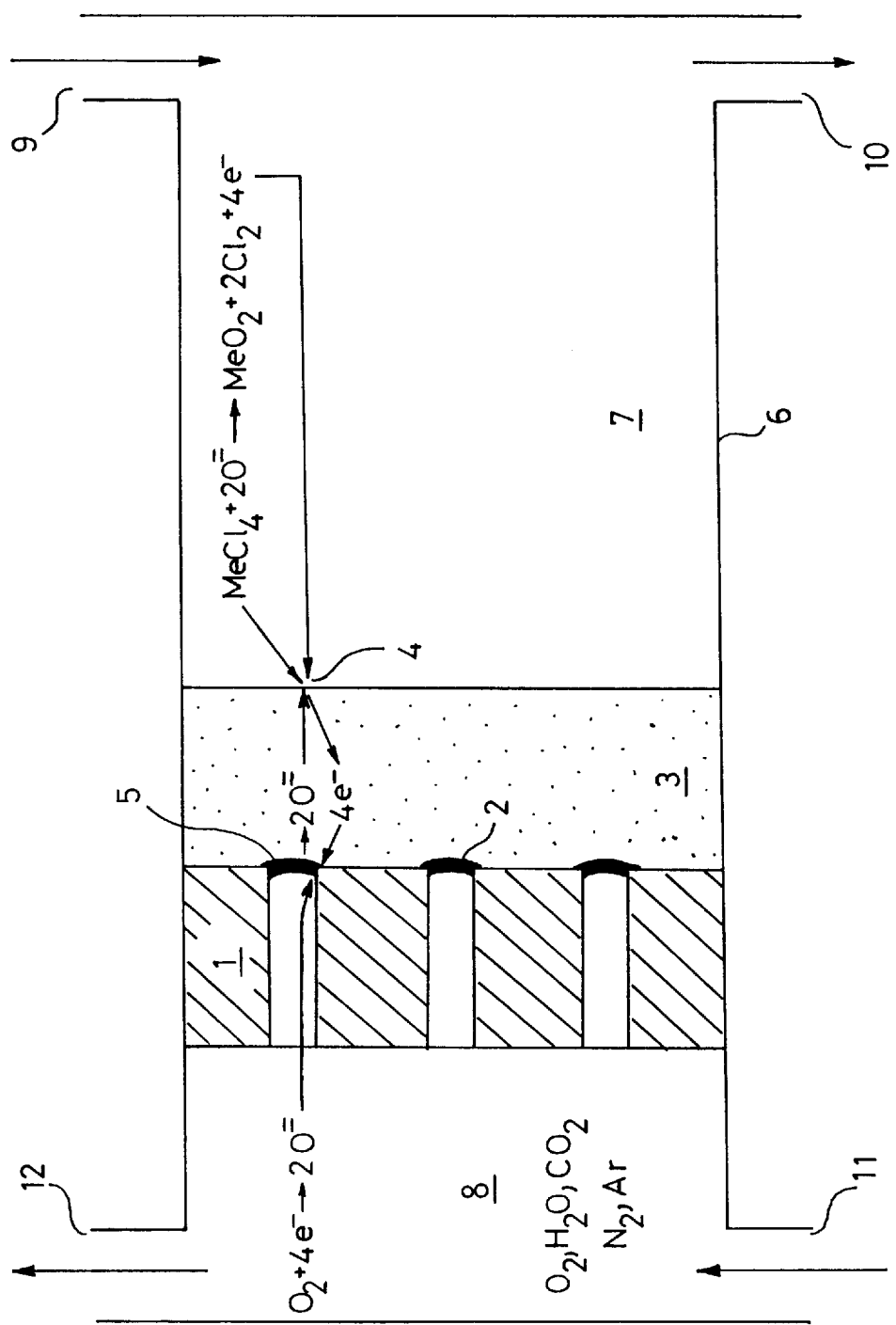
FIG. 1 is a representation of the basic low pressure EVD process and its resulting deposit over a porous substrate.

FIG. 1 shows schematically the state-of-the-art low pressure EVD process for metal oxide layer formation. As applied to the deposition of yttria-stabilized zirconia, following reactions are involved:

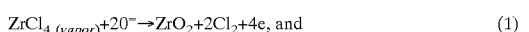

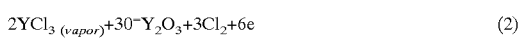

The porous substrate 1 in FIG. 1 is sealed in an envelope 6 to create two separate chambers 7 and 8 which communicate through the porous substrate 1. A typical substrate thickness is 0.04", a typical porosity level is 30 percent by volume, and a typical pore size range is from 1 to 100 micrometers. Each chamber has a gas inlet and outlet, 9, 10 and 11, 12, respectively. The vacuum EVD process is conducted at a temperature of 1200° C. and a pressure of 1 Torr or lower. Vapors of zirconium chloride and yttrium chloride are introduced into chamber 7 together with an inert carrier gas such as nitrogen or argon. A mixture of oxygen and water vapor, together with inert diluents such as nitrogen or Argon, is introduced into chamber 8. The pressure difference between chamber 7 and 8 is adjusted to prevent excessive zirconium chloride diffusion into and reaction with the porous body of, for instance, the porous lanthanum manganite substrate 1. Water vapor and oxygen diffuse as gases through the pores and react with the chloride vapors directly by chemical vapor deposition (CVD) on the pore perimeter which faces the chloride vapor containing chamber 7. The build-up of oxide reaction product 2 via CVD will lead to pore closure and to physical separation of the reactants and will prevent any further direct chemical reaction between them. A steep oxygen concentration gradient is created simultaneously across the oxide layer. This gradient is the driving force for the oxide film growth.

Every EVD process which is executed over porous substrates, therefore, is preceded by a short period of pore closure by CVD. After pore closure, the actual electrochemical transport of oxygen ions and the exchange of electrons within the growing oxide layer and at the site of reaction, as indicated schematically by the number 4, is the only mechanism by which the thin oxide layer 3 can grow in thickness, thus the name electrochemical vapor deposition, EVD. A requirement for the diffusion of oxygen ions thorough the pore free oxide deposit 3 toward the source of zirconium and yttrium chloride vapors is the presence of a small degree of electronic conduction in the deposited mixed oxide. This small but sufficient electronic conduction is, in part, a result of the high temperature at which the oxide deposition reaction takes place and is also due to the extremely low oxygen partial pressure which exists at the reaction site 4 on the surface of the growing yttria stabilized zirconia layer. This means, that yttria-stabilized zirconia, which is used in practical devices as a pure oxygen-ionic conductor, is actually a mixed conductor, oxygen-ionic/electronic, under the deposition conditions. The description of the formation of yttria-stabilized zirconia according to reaction equations (1) and (2) therefore represents also the principle of the growth mechanism for mixed conducting, oxygen-ionic/electronic oxide layers. The other reaction byproduct, namely free chlorine gas is removed by vacuum pumps, which is essential to enhance the growth rate of the oxide layer.

Figure 2:
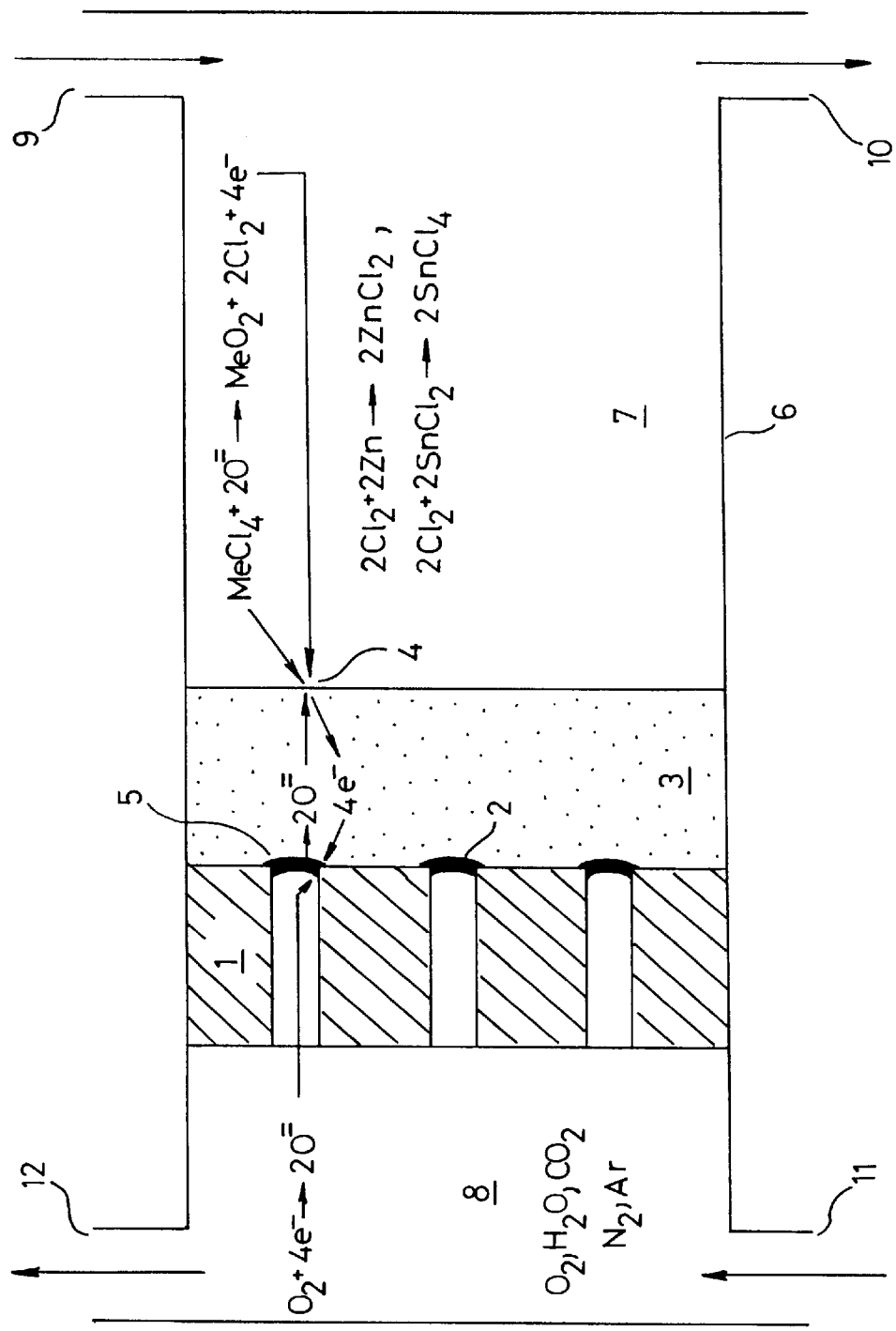
FIG. 2 is a representation of the atmospheric pressure EVD process employing chlorine removal with vapors of metals or vapors of metal chlorides.

FIG. 2 shows the same basic reaction scheme as explained in FIG. 1, however representing one important embodiment of this invention, whereby the EVD process can be executed at or near atmospheric pressure through the introduction of zinc metal vapor together with the zirconium chloride and the yttrium chloride vapors. The free chlorine from the EVD reaction combines with zinc to form zinc chloride according to the chemical reaction equation:

$$Zn_{(vapor)}Cl_2 ZnCl_{2\ (vapor)} \tag{3}$$

Instead of metal vapors, the vapors of metal chlorides in a low valence state can fulfill the function of eliminating the free chlorine from the EVD reaction. Tin II-chlorine in the vapor form is an effective chlorine accepter according to the chemical reaction equation:

$$SnCl_{2\ (vapor)} + Cl_2 \rightarrow SnCl_{4\ (vapor)} \tag{4}$$

Other metal chlorides, such as bismuth I-chloride can be employed as chlorine accepter vapors also.

Figure 3:
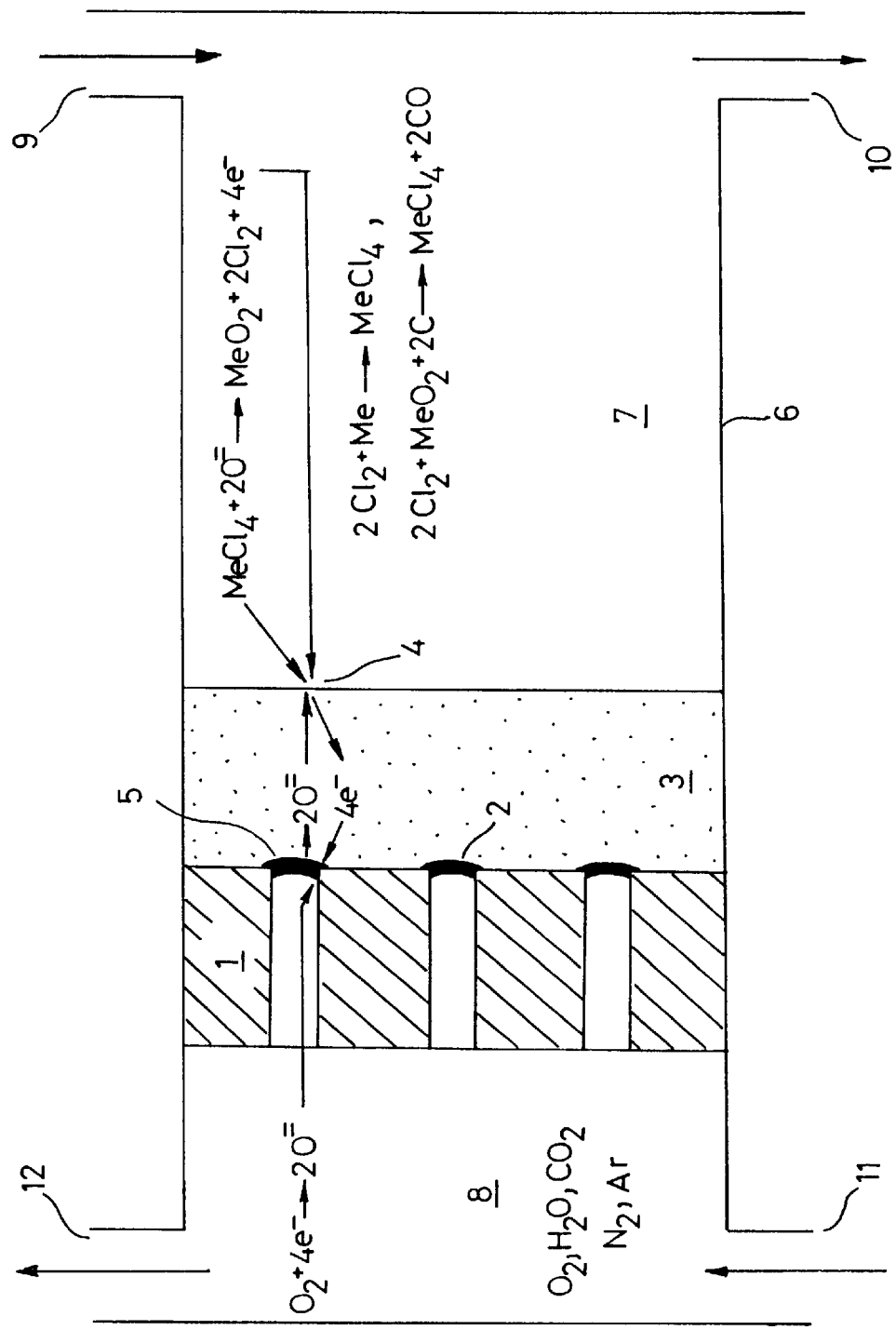
FIG. 3 is a representation of the atmospheric pressure EVD process employing chlorine remove and metal chloride regeneration.

FIG. 3 shows a special embodiment of the invention, because the chlorine gas elimination from the EVD process is accomplished with reactants that replenish the chlorides that have been consumed in the process of oxide growth. This process, in the case of yttria-stabilized zirconia deposition, uses zirconium and yttrium metal to react with the free chlorine to replenish the used metal chlorides as explained by the chemical reaction equations:

$$Zr + 2Cl_2 \rightarrow ZrCl_{4\ (vapor)}, \text{ and} \tag{5}$$

$$2Y + 3Cl_2 \rightarrow 2YCl_{3\ (vapor)}. \tag{6}$$

Another much less expensive method for chlorine removal and metal chloride replenishment, when compared with the method of using the metals zirconium and yttrium, is that according to the chemical reaction equation:

$$ZrO_2 + 2C + 2Cl_2 \rightarrow ZrCl_{4\ (vapor)} + 2CO. \tag{7}$$

In this particular method, a significant process cost reduction can be achieved, because the use of low cost compacted yttria-stabilized zirconia powder mixtures with carbon result in the simultaneous replenishment of $ZrCl_4$ and $YCl_3$ vapors in the correct proportion, when such mixtures react with the free chlorine from the EVD reaction.

Figure 4:
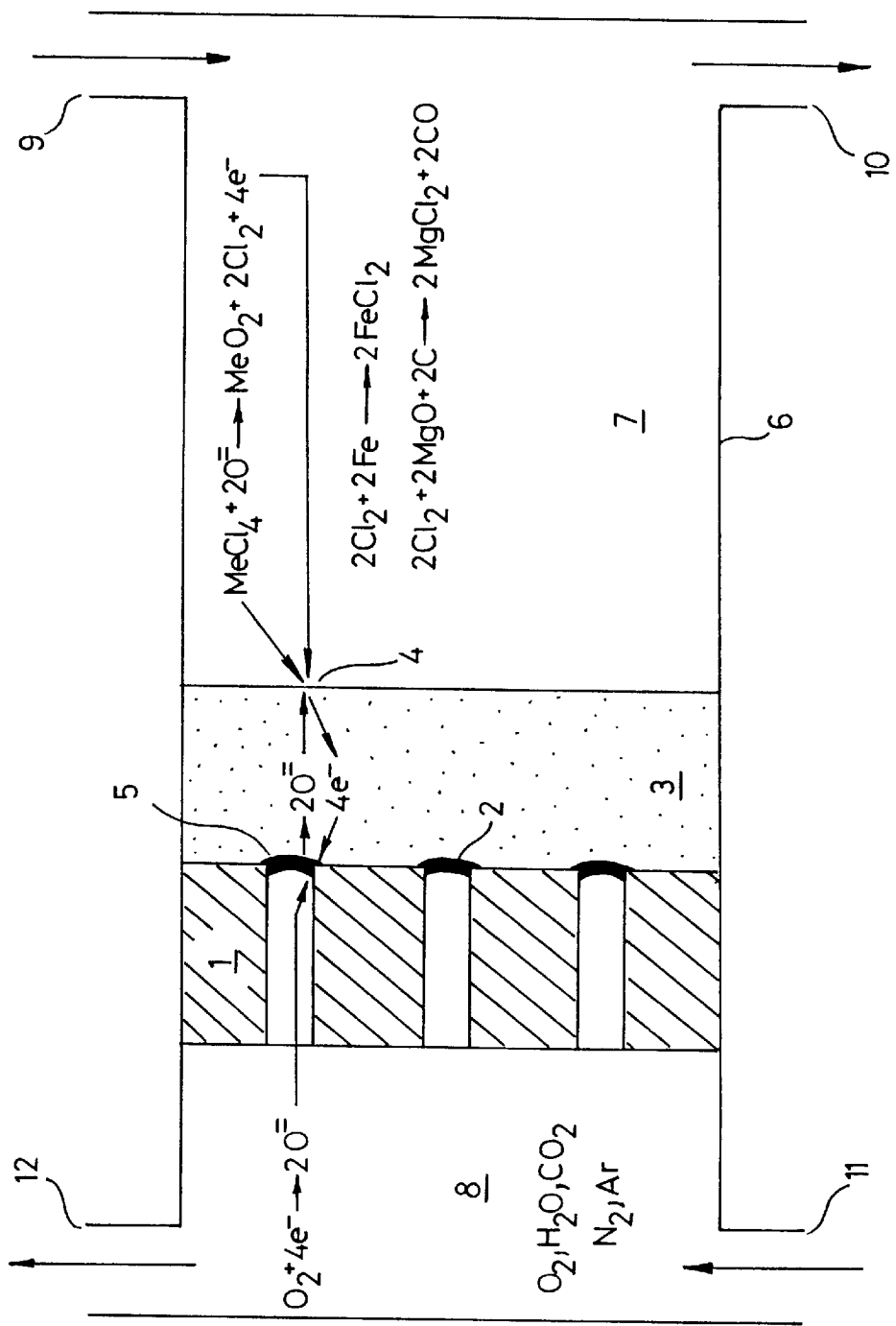
FIG. 4 is a representation of the atmospheric pressure EVD process employing chlorine removal with sacrificial solid metals and solid oxides.

FIG. 4 shows another embodiment of a high pressure EVD process with free chlorine removal by sacrificial metal and metal oxide carbon admixtures. In this process variation, when applied to the deposition of stabilized zirconia, iron can be used as sacrificial metal, and magnesium oxide or calcium oxide in mixtures with carbon, serve also effectively as means to eliminate chlorine gas from the deposition reaction according to the chemical reaction equations:

$$Fe + Cl_2 \rightarrow FeCl_{2\ (vapor)}, \text{ and} \tag{8}$$

$$MgO + C + Cl_2 \rightarrow MgCl_{2\ (vapor)}. \tag{9}$$

The effective use of solid materials for the removal of free chlorine from the EVD reaction is accomplished by placing the materials distributed and in close proximity to the substrates that are being coated with oxygen ion conducting oxide layers.

The deposition of yttria-stabilized zirconia layers by EVD is important, however, zirconia can also be stabilized in its oxygen ion conducting crystal structure (body centered fluorite) by other elements than yttrium. The preferred doping elements for zirconia for making it an oxygen ion conductor or a mixed conducting, oxygen-ionic/electronic, mixed oxide are at least one element of the group comprising scandium, yttrium, ytterbium cerium, and praseodymium. In general, earth alkaline elements, rare earth elements including the lanthanides, can be used in mixture (solid solution) with a major amount of zirconia, exceeding 70% on a molar basis.

While the major objective of this invention is the establishment of an atmospheric pressure EVD process, the described methods of chlorine removal by the various reaction methods as represented by the chemical reactions equations (3) through (9), can also be used successfully for low and intermediate pressure EVD processes. The chemical reactions (3) through (9) are not limited in their effectiveness to atmospheric pressure conditions and are useful in the efforts to simplify, improve, and cost reduce lower pressure EVD processes also, because the described methods for removal of the chlorine byproduct by chemical means are more efficient than mechanical pumping means so that the cost of pumping hardware can be significantly reduced.

The chemical reactions (1) through (9) involve metal chlorides and free chlorine. Similar reactions can be executed with metal bromides and free bromine, as well as with metal iodides and free iodine. These halides find application when higher vapor pressures of metal halides are desired for lower temperature EVD processes, since metal bromides and metal iodides have higher vapor pressures than metal chlorides at a given temperature. Metal chlorides are used mainly because of their lower cost.

Yttria-stabilized zirconia is only one example of an oxygen ion conductor. Oxygen ion conductors on the basis of doped ceria, doped hafnia, and doped thoria, can be deposited as oxide layers by the EVD process. The EVD process for these oxides would entail the use of vaporized halides of these elements and their dopant elements, preferably as chlorides, in a similar fashion as zirconium tetrachloride and yttrium trichloride vapors are used in above examples for the deposition of yttria-stabilized zirconia. When oxide/carbon mixtures are used in such instances for chlorine removal, one would use doped ceria/carbon, doped hafnia/carbon, and doped thoria/carbon mixtures in the process for producing doped ceria, doped hafnia, and doped thoria layers, respectively, similar to reaction equation (7).

The preferred doping elements for ceria as a pure oxygen ion conductor or as mixed conducting, oxygen-ionic/electronic, oxide are at least one element of the group of yttrium, gadolinium, samarium, neodymium, and praseodymium. Doping elements for hafnia and thoria are at least one element of the group comprising scandium, yttrium, ytterbium, cerium, and praseodymium.

Figure 5:
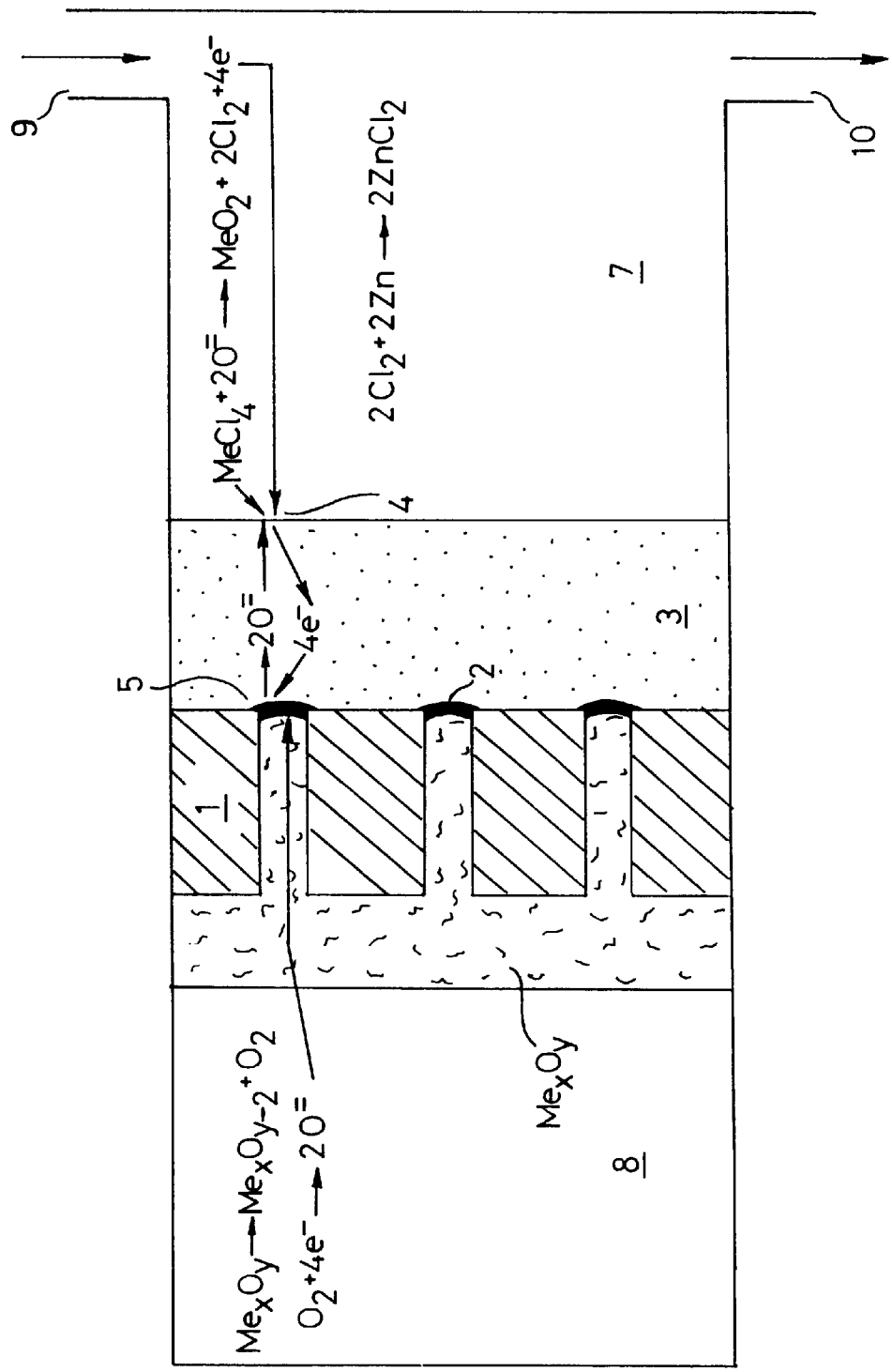
FIG. 5 is a representation of the atmospheric pressure EVE process employing solid oxide materials as a source for reactant oxygen.

FIG. 5 shows a method for providing oxygen reactant for the EVD reaction, different from the delivery of gaseous oxygen as shown in the above figures. The oxygen is provided by the incorporation of solid oxides, dispersed in the porosity of the substrate, which easily donate some of their oxygen to the electrochemical deposition reaction. The oxygen donating oxide can also be located on the inside of a tubular substrate or similar. In this oxygen delivery method the oxygen is derived from the crystal lattice of the oxygen-donating solid oxide. During the EVD process oxygen diffuses as an ion through the growing oxide layer as if it had been dispensed from a gaseous oxygen containing source.

The base metal of the oxygen-donating oxide may be reduced by the oxygen loss to a lower valence state or even to the metal itself. Suitable oxides for this application are oxides of the elements praseodymium, copper, nickel, iron, cobalt, zinc, tin, and manganese, as well as the complex oxides such as lanthanum manganite, strontium ferrite, praseodymium cobaltite, lanthanum cobaltite, and lanthanum nickelate, The use of this method for supplying reactant oxygen in the EVD reaction is especially well suited for atmospheric pressure EVD processes according to this invention and as described in FIGS. 2,3 and 4, because such oxygen-donating oxides maintain a higher capacity of oxygen at elevated pressures than they maintain under vacuum conditions. It also becomes apparent that a substrate upon which an oxide layer is deposited by EVD can function as an oxygen donator itself, however, this can lead to chemical destruction of the substrate if a certain degree of oxygen donation is exceeded. In any case, proper equilibration of the substrate and oxygen-donating-oxide with gaseous oxygen after the EVD process is a requirement.

The description of this invention makes it obvious that layers of other oxygen ion conducting oxides and mixed conducting oxides beside doped zirconia can be deposited by atmospheric EVD, as well as by lower than atmospheric pressure EVD according to this invention. Such oxides include doped ceria and doped hafnia as well as mixed oxides of the perovskite family, such as doped manganites, doped cobaltites, and doped ferrites, having the general chemical formula $ABO_3$, wherein A is at least one of the elements calcium, strontium, yttrium, and lanthanum and other elements of the group of lanthanides in the periodic chart of elements, and wherein B represents at least one of the elements in the group comprising chromium, manganese, iron, cobalt, nickel, aluminum, gallium, and indium.

OPERATION

The execution of operations for an atmospheric EVD process, according to this invention, is described for two examples of the process and as applied to the deposition of yttria-stabilized zirconia onto a porous stabilized zirconia substrate.

Example 1

A porous (~30 vol %) calcia-stabilized zirconia substrate of ~13 mm outer diameter and 2 mm wall thickness is mounted vertically with its closed end up in a 50 mm inner diameter alumina reactor tube. The porous substrate tube is purged on the inside via a thin alumina injection tube with a low flow of oxygen, diluted with nitrogen and humidified with water vapor at room temperature (~3 $H_2O$) and at atmospheric pressure. Before the deposition reaction can be initiated, the reactor tube must be purged with a continuous flow of inert gas such as nitrogen or argon, and the reactor tube, with the inserted substrate tube must be heated to 1000° C. to 1300+ C. When the reaction/deposition zone has reached its target temperature, vapors of zirconium tetrachloride, yttrium trichloride, and zinc metal are introduced in the reaction zone with the help of an inert carrier gas, such as nitrogen or argon, and surround the substrate tube. Oxide layer growth on the substrate tube takes place immediately.

The delivery of the metal chloride and metal vapors in the desired proportions is achieved by placing metal chloride vapor source containers at specific temperature positions within the EVD reactor tube but ahead of the reaction zone (with respect to gas flow). Proper reactant ratios and reactant delivery rates are obtained by vapor pressure control (temperature level) of the metal chloride sources as well as by inert gas flow rate adjustment, both of which are best determined by experiment. A much preferred method of chlorine delivery, however, consists of controlled dispensing of solid metal chlorides and zinc metal in the form of granular powders onto hot surfaces within the reactor tube and ahead of the reaction/deposition zone for flash evaporation.

The delivery rate of chlorides to the substrate outside can vary widely, as well as the flow rate of the nitrogen diluted oxygen gas on the substrate tube inside. Yttria-stabilized zirconium oxide will form on the substrate surface and grow in thickness by the EVD reaction. The excess flow of chloride and metal vapors will condense in the colder part of the reactor tube exit, where absorbers of fumes eliminate hazardous compounds. Care must be taken that the oxygen containing exit gases from the substrate tube inside are kept from entering the reaction/deposition zone by back diffusion, and appropriate sealing of the open end of the substrate tube into a gas impervious extension tube, preferably made of alumina, is required.

Example 2

A porous substrate tube is mounted in the reactor tube as described in the first example. The substrate tube is axially surrounded by rods, strips or tube of a compacted mixture of yttria-stabilized zirconia with carbon, consisting of 20% by weight of lamp black and 80% by weight of 10 mol % yttria-stabilized zirconia powder of a particle size of less than 5 micrometers. The geometric surface area of the oxide carbon compact should be equal or larger than the substrate surface area. The spacing of the oxide carbon compacts from the substrate should be as close as possible and practical.

The porous zirconia substrate together with the compacted oxide-carbon mixtures are heated in an inert atmosphere to the desired deposition temperature in order to avoid carbon oxidation from oxygen diffusion through the substrate tube wall. Shortly before the introduction of the inert gas diluted vapors of zirconium tetrachloride and yttrium trichloride, the substrate tube inside is supplied with a flow of humidified oxygen which is also diluted with an inert gas like nitrogen, as described in example 1. After the chloride vapors have been introduced and after the pores of the substrate have been closed off, one can reduce the flow of new chlorides significantly, because the metal chlorides are replenished in the reaction zone by the reaction of the free chlorine from the EVD process with the intimate mixture of yttria-stabilized zirconia with carbon. A small residual flow of new chloride vapors, diluted with inert carrier gas is maintained in order to remove the carbon monoxide gas which is a byproduct of the metal chloride regeneration reaction.

In both operational examples as described above, it is important to measure the rate of pore closure by CVD. This is accomplished by the provision of a differential pressure sensor in the oxygen reactant feed stream to the substrate tube inside. By establishing a small overpressure inside the substrate tube one can follow the process of pore closure dynamically with a manometer. By observing the pressure rise during the pore closure phase of the deposition process one can determine the point in time at which the EVD growth mechanism takes over and controls further oxide layer growth in thickness.

Since substrate material compositions, levels of porosity, pore size, and deposition temperature can vary widely from application to application, one must find the optimal EVD conditions for each such application by experimental means, and the two examples of operation provide a general approach of how to conduct the basic operations of the various embodiments of the atmospheric pressure EVD process according to this invention.

What is claimed is:

1. An electrochemical vapor deposition process for the fabrication of oxygen ion conducting oxide layers in a deposition chamber by an electrochemically induced reaction of vaporized metal halides with oxygen from at least one of oxygen gas and oxygen containing reactants to form said oxygen ion conducting oxide layers as the reaction product, comprising the steps of : reacting metal halide vapors with oxygen ions stemming from said oxygen gas or said oxygen containing reactants to form said oxygen ion conducting oxide layers, maintaining said oxygen gas and said oxygen containing reactants separated from said metal halide vapors by said oxygen ion conducting oxide layers, whereby oxygen stemming from said oxygen gas or oxygen reactants at one side of said oxygen ion conducting oxide layer diffuses as oxygen ions through said oxygen ion conducting oxide layers and reacts with said vaporized metal halides at the other side of said oxygen ion conducting oxide layers so as to form metal oxides and causing growth in thickness of said oxygen ion conducting oxide layers while, at the same time, forming free halide as reaction byproduct, and reacting free halide with zinc metal vapor present at said other side of said oxygen ion conducting oxide layers thereby forming zinc halide vapor resulting in an increased growth rate of said oxide layers.

2. An electrochemical vapor deposition process as recited in claim 1, wherein said vaporized metal halides are chlorides.

3. An electrochemical vapor deposition process as recited in claim 1, wherein said oxygen ion conducting oxide layer consists of zirconium oxide stabilized with at least one oxide of at least one element selected from the group consisting of scandium, yttrium, ytterbium, cerium, and praseodymium.

4. An electrochemical vapor deposition process as recited in claim 1, wherein said oxygen ion conducting oxide layer is made of cerium oxide in solid solution with at least one oxide of at least one element selected from the group consisting of yttrium, ytterbium, samarium, gadolinium, and praseodymium.

5. An electrochemical vapor deposition process as recited in claim 1, wherein said oxygen ion conducting oxide layer is a solid state solution of rare earth element oxides in hafnium oxide.

6. An electrochemical vapor deposition process as recited in claim 1, wherein said oxygen ion conducting oxide layer is yttrium oxide-stabilized zirconia, and wherein said free halide is reacted with yttrium metal and zirconium metal.

7. An electrochemical vapor deposition process as recited in claim 1, wherein said oxygen ion conducting oxide layers consist of complex oxides of the general formula $ABO_3$, wherein A is at least one element of the group consisting of calcium, strontium, yttrium, lanthanum and other elements of the group of lanthanides in the periodic chart of elements, and wherein B represents at least one of the elements in the group consisting of chromium, manganese, iron, cobalt, nickel, aluminum, gallium, and indium.

8. An electrochemical vapor deposition process as recited in claim 1, wherein said oxygen reactant is derived from at least one of the group consisting of oxygen gas, water vapor, and carbon dioxide.

9. An electrochemical vapor deposition process as recited in claim 1, wherein said oxygen reactant if provided by at least one oxide of at least one element selected from the group consisting of praseodymium, copper, nickel, cobalt, iron, zinc, tin, and manganese.

10. An electrochemical vapor deposition process as recited in claim 1, wherein said oxygen reactant is provided by at least one oxide selected from the group consisting of lanthanum manganite, strontium ferrite, praseodymium cobaltite, lanthanum cobaltite, and lanthanum nickelate.

11. An electrochemical vapor deposition process for the fabrication of oxygen ion conducting oxide layers of rare earth element stabilized zirconium oxide in a deposition chamber by an electrochemically induced reaction of vaporized halides of rare earth elements and zirconium with oxygen from at least one of oxygen gas and oxygen containing reactants to form said oxygen ion conducting layers as the reaction product, comprising the steps of: reacting vaporized halides with oxygen ions stemming from said oxygen gas or said oxygen containing reactants to form said oxygen ion conducting oxide layers, maintaining said oxygen gas and said oxygen containing reactants separated from said vaporized halides by said oxygen ion conducting oxide layers, whereby oxygen stemming from said oxygen gas oxygen reactants at one side of said oxygen ion conducting oxide layer diffuses as oxygen ions through said oxygen ion conducting oxide layers and reacts with said vaporized metal halides at the other side of said oxygen ion conducting oxide layers so as to form metal oxides and causing growth in thickness of said oxygen ion conducting layers while, at the same time, forming free halide as reaction byproduct, and reacting said free halide with a mixture of rare earth element-stabilized zirconium oxide and carbon thereby increasing the growth rate of said ion conducting oxide layers.

12. An electrochemical vapor deposition process as recited in claim 11, wherein said vaporized metal halides are chlorides.

13. An electrochemical vapor deposition process as recited in claim 11, wherein said oxygen-containing reactants are derived from at least one of the group consisting of oxygen gas, water vapor and carbon dioxide.

14. An electrochemical vapor deposition process as recited in claim 11, wherein said oxygen-containing reactants are provided by ate least one oxide of at least one element selected from the group consisting of praseodymium, copper, nickel, cobalt, iron, zinc, tin, and manganese.

15. An electrochemical vapor deposition process as recited in claim 11, wherein said oxygen reactant is provided by at least one oxide selected from the group consisting of lanthanum manganite, strontium ferrite, praseodymium cobaltite, lanthanum cobaltite, and lanthanum nickelate.

16. An electrochemical vapor deposition process for the fabrication of oxygen ion conducting layers of solid state solutions of rare earth element oxide in cerium oxide in a deposition chamber by an electrochemically induced reaction of vaporized halides of rare earth elements and cerium with oxygen from at least one of oxygen gas and oxygen containing reactants to form said oxygen ion conducting oxide layers as the reaction product, comprising the steps of: reacting said vaporized halides with oxygen ions stemming form said oxygen gas or said oxygen containing reactants to form said oxygen ion conducting oxide layers, maintaining said oxygen gas and said oxygen containing reactants separated from said vaporized halides by said oxygen ion conducting oxide layers, whereby oxygen stemming from said oxygen gas or oxygen reactants at one side of said oxygen ion conducting oxide layers diffuses as oxygen ions through said oxygen ion conducting oxide layers and reacts with said vaporized metal halides at the other side of said oxygen ion conducting layers so as to form metal oxides and causing growth in thickness of said oxygen ion conducting oxide layers while, at the same time, forming free halide as reaction byproduct, and reacting said free halide with rare earth element oxide solution in cerium oxide with carbon thereby increasing the growth rate of said ion conducting oxide layers.

17. An electrochemical vapor deposition as recited in claim 16, wherein said vaporized metal halides are chlorides.

18. An electrochemical vapor deposition as recited in claim 16, wherein said oxygen-containing reactants are derived from at least one of the group consisting of oxygen gas, water vapor and carbon dioxide.

19. An electrochemical vapor deposition process as recited in claim 16, wherein said oxygen containing reactants are provided by at least one oxide of at least one element selected from the group consisting of praseodymium, copper, nickel, cobalt, iron, zinc, tin, and manganese.

20. An electrochemical vapor deposition process as recited in claim 16, wherein said oxygen-containing reactants are provided at least one oxide selected from the group consisting of lanthanum manganite, strontium ferrite, praseodymium cobaltite, lanthanum cobaltite, and lanthanum nickelate.

* * * * *